(12) United States Patent
Liu

(10) Patent No.: US 9,761,641 B2
(45) Date of Patent: Sep. 12, 2017

(54) COLOR FILTER SUBSTRATE AND METHOD FOR MANUFACTURING THE SAME, OLED DISPLAY PANEL AND DISPLAY APPARATUS

(71) Applicant: BOE TECHNOLOGY GROUP CO., LTD., Beijing (CN)

(72) Inventor: Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/094,891

(22) Filed: Apr. 8, 2016

(65) Prior Publication Data
US 2017/0033164 A1 Feb. 2, 2017

(30) Foreign Application Priority Data
Jul. 29, 2015 (CN) .......................... 2015 1 0454413

(51) Int. Cl.
*H01L 27/32* (2006.01)
*H01L 51/52* (2006.01)
(Continued)

(52) U.S. Cl.
CPC ............ *H01L 27/322* (2013.01); *G02B 5/003* (2013.01); *G02B 5/0808* (2013.01); *G02B 5/201* (2013.01);
(Continued)

(58) Field of Classification Search
CPC ............... H01L 27/322; H01L 51/5284; H01L 51/5271; H01L 27/3244; H01L 51/004;
(Continued)

(56) References Cited

U.S. PATENT DOCUMENTS

2010/0090595 A1* 4/2010 Nomura ........... B29D 11/00596
313/506
2010/0096655 A1* 4/2010 Lee ..................... H01L 27/3253
257/98
(Continued)

FOREIGN PATENT DOCUMENTS

CN 1992329 A 7/2007
CN 102263053 A 11/2011
(Continued)

OTHER PUBLICATIONS

First Office Action dated Sep. 26, 2016, for corresponding Chinese Application No. 201510454413.1.
(Continued)

*Primary Examiner* — Fernando L Toledo
*Assistant Examiner* — Adam S Bowen
(74) *Attorney, Agent, or Firm* — Kinney & Lange, P.A.

(57) ABSTRACT

Embodiments of the present invention disclose a color filter substrate including: a base plate, and a black matrix layer and a barrier pad layer disposed stackedly in sequence on the base plate, the barrier pad layer including a plurality of barrier pads disposed on the same layer; wherein, an orthographic projection of a pattern of each barrier pad onto the base plate is located within a region where a pattern of the black matrix layer is located; and, a surface of each barrier pad is provided with an auxiliary functional layer for absorption or reflection of a light irradiated on the surface of each barrier pad. Correspondingly, embodiments of the present invention disclose a method for manufacturing a color filter substrate, an OLED display panel and a display apparatus.

11 Claims, 4 Drawing Sheets

(51) Int. Cl.
    *G02B 5/20* (2006.01)
    *G02B 5/00* (2006.01)
    *G02B 5/08* (2006.01)
    *G02B 5/22* (2006.01)
    *H01L 51/00* (2006.01)

(52) U.S. Cl.
    CPC .......... *G02B 5/223* (2013.01); *H01L 27/3244* (2013.01); *H01L 51/004* (2013.01); *H01L 51/0035* (2013.01); *H01L 51/5271* (2013.01); *H01L 51/5284* (2013.01)

(58) Field of Classification Search
    CPC ..... H01L 51/0035; G02B 5/003; G02B 5/201; G02B 5/0808; G02B 5/223; C23F 1/00
    USPC .......................................................... 257/40
    See application file for complete search history.

(56) References Cited

U.S. PATENT DOCUMENTS

2014/0125931 A1* 5/2014 Niu .................... G02F 1/133514
                                                                349/106
2015/0295154 A1* 10/2015 Tu ....................... H01L 33/0079
                                                                 438/27

FOREIGN PATENT DOCUMENTS

CN         102293053 A     12/2011
WO         02/15292 A2     2/2002

OTHER PUBLICATIONS

Second Chinese Office Action, for Chinese Patent Application No. 201510454413.1, dated May 2, 2017, 10 pages.

* cited by examiner

COLOR FILTER SUBSTRATE AND METHOD FOR MANUFACTURING THE SAME, OLED DISPLAY PANEL AND DISPLAY APPARATUS

CROSS-REFERENCE TO RELATED APPLICATION

This application claims the benefit of Chinese Patent Application No. 201510454413.1 filed on Jul. 29, 2015 in the State Intellectual Property Office of China, the whole disclosure of which is incorporated herein by reference.

BACKGROUND

Technical Field

Embodiments of the present invention relate to the field of display technology, and particularly to a color filter substrate, a method for manufacturing the color filter substrate, an OLED display panel and a display apparatus.

Description of the Related Art

At present, Organic Light-Emitting Display (OLED) panel has advantages of smaller thickness and lightness, active light emission (without back light source), no viewpoint problem, high clarity, high brightness, fast response, low energy consumption, wide range of temperature, strong seismic capacity, low cost and flexible displaying, etc.

Top-emission type organic light-emitting display panel is formed by assembling a color filter substrate with an array substrate having a TFT driving structure. The array substrate includes a lower part of a top-emission type organic light-emitting device. RGB light-emitting material or white organic light-emitting diode may be adopted as the top-emission type organic light-emitting device in light-emitting manner. The color filter substrate comprises a black matrix structure, a color filter layer structure in which at least three filters with different colors are included, and a barrier pad structure for supporting purpose. The filters are disposed separately in regions where the corresponding sub-pixel unit is located, respectively. As a result, when light from a light source passes through the filters with different colors, lights with different colors are generated in the regions where the corresponding sub-pixel unit is located, respectively. Because material for barrier pad generally comprises materials with high elastic recovery rate and high external pressure deformation bearing capacity, for example, negative acryl photoresist material which is also transparent material, optical crosstalk will be occurred among lights from adjacent sub-pixel units in the color filter substrate of the top-emission type organic light-emitting display, which results in occurrence of light mixing, thereby adversely affecting display effect of the organic light-emitting display panel.

Accordingly, it is an urgency to solve the technical problem in the art of how to prevent occurrence of the optical crosstalk among lights from adjacent sub-pixel units, thereby improving a display effect.

SUMMARY

Accordingly, according to a first aspect, there provides a color filter substrate, comprising: a base plate, and a black matrix layer and a barrier pad layer disposed stackedly in sequence on the base plate, the barrier pad layer comprising a plurality of barrier pads disposed on the same layer; wherein, an orthographic projection of a pattern of each barrier pad onto the base plate is located within a region where a pattern of the black matrix layer is located; and, a surface of each barrier pad is provided with an auxiliary functional layer for absorption or reflection of a light irradiated on the surface of each barrier pad.

According to a second aspect, there further provides a method for manufacturing the abovementioned color filter substrate, the method comprising steps of: forming patterns of a black matrix layer and of barrier pads on a base plate in sequence so that an orthographic projection of the pattern of each barrier pad onto the base plate is located within a region where the pattern of the black matrix layer is located; and, forming a pattern of an auxiliary functional layer for absorption or reflection of a light irradiated on the surface of each barrier pad, on a surface of the pattern of each barrier pad.

According to a third aspect, there further provides an organic light-emitting display panel comprising the abovementioned color filter substrate according to the embodiments of the present invention and an array substrate opposite to each other; wherein, the array substrate comprises a RGB light-emitting material layer or a white organic light-emitting diode.

According to a fourth aspect, there also provides a display apparatus comprising the abovementioned organic light-emitting display panel according to the embodiments of the present invention.

BRIEF DESCRIPTION OF THE DRAWINGS

FIG. 1b is a top view of FIG. 1a;

FIG. 2b is a top view of FIG. 2a;

DETAILED DESCRIPTION OF THE EMBODIMENTS

Figure 1A:
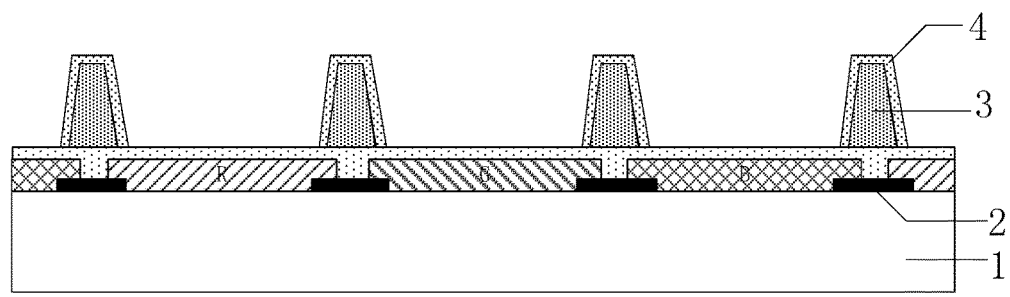
FIG. 1a is a schematic structural view of a color filter substrate according to an embodiment of the present invention.

A description of embodiments of a color filter substrate and a method for manufacturing the same, an OLED display panel and a display apparatus will be made in detail as below with reference to embodiments of the present invention taken in conjunction with the accompanying drawings.

Herein, thicknesses and shapes of these layers shown in the accompanying drawings are not used to reflect actual scale of the color filter substrate, but are used to indicate and explain only the contents of the present invention.

Referring to FIGS. 1a, 1b, 2a and 2b, in an embodiment of the present invention, there provides a color filter substrate, and the color filter substrate comprises a base plate 1, and a black matrix layer 2 and a barrier pad layer disposed stackedly in sequence on the base plate 1, and, the barrier pad layer comprises a plurality of barrier pads 3 disposed on the same layer. Herein, an orthographic projection of a pattern of each barrier pad 3 onto the base plate 1 is located within a region where a pattern of the black matrix layer 2 is located; and, a surface of each barrier pad 3 is provided with an auxiliary functional layer 4 for absorption or reflection of a light irradiated on the surface of each barrier pad 3.

In the abovementioned color filter substrate according to an embodiment of the present invention, the orthographic projection of the pattern of each barrier pad onto the base plate 1 is located within the region where the pattern of the black matrix layer is located, so an aperture ratio of the color filter substrate will not be taken up. Meanwhile, the surface of each barrier pad is provided with the auxiliary functional layer for absorption or reflection of a light irradiated on the surface of each barrier pad, so, occurrence of the optical crosstalk among lights from adjacent sub-pixel units of the color filter substrate is prevented and the light mixing is avoided, and light extraction efficiency and display contrast are further improved, thereby improving a display effect.

In one implementation, specific structure of the auxiliary functional layer may be designed in accordance with practical requirement, as long as the auxiliary functional layer plays a role on absorption or reflection of a light irradiated on the surface of each barrier pad. In the abovementioned color filter substrate according to embodiments of the present invention, there may include three following specific embodiments.

In the color filter substrate according to a first specific embodiment of the present invention, the auxiliary functional layer may be provided as a light absorption layer that is formed of opaque metal oxide material, and the light absorption layer may cover over the surface of each barrier pad. Since the light absorption layer is formed of opaque metal oxide material, such as molybdenum oxide material, the light irradiated on the surface of each barrier pad may be adsorbed, which achieves an effect of preventing the light from penetrating through each barrier pad, and avoids a light mixing.

In the color filter substrate according to a second specific embodiment of the present invention, the auxiliary functional layer may be provided as a light reflection layer formed of metal material, and the light reflection layer may cover over the surface of each barrier pad. Since the light reflection layer is formed of metal material, such as metal materials including silver, copper, aluminum, etc., on one hand, the light irradiated on the surface of each barrier pad may be reflected, which prevents occurrence of the optical crosstalk among lights from adjacent sub-pixel units of the color filter substrate and avoids a light mixing. On the other hand, due to its electrical conductivity, the light reflection layer may come into a direct contact with a cathode of an organic light-emitting device on the array substrate, which improves electrical conductivity of the cathode and avoids drop off of the voltage because of reason including impedance of the cathode in a large size display, thereby avoiding the problem of uneven luminance between edges and the center of the display screen.

Figure 2A:
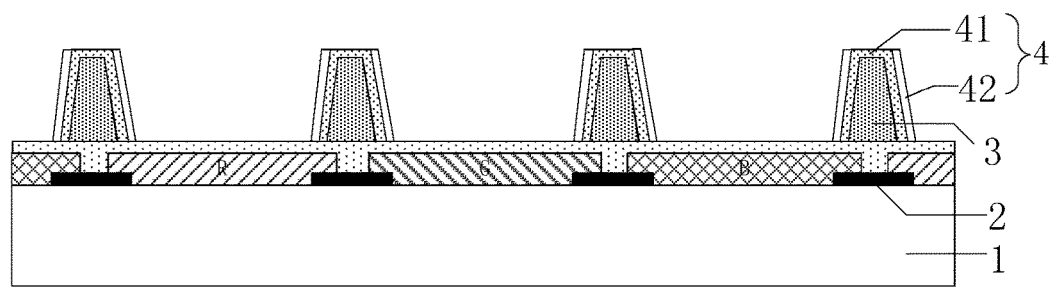
FIG. 2a is a schematic structural view of a color filter substrate according to another embodiment of the present invention.
Figure 2B:
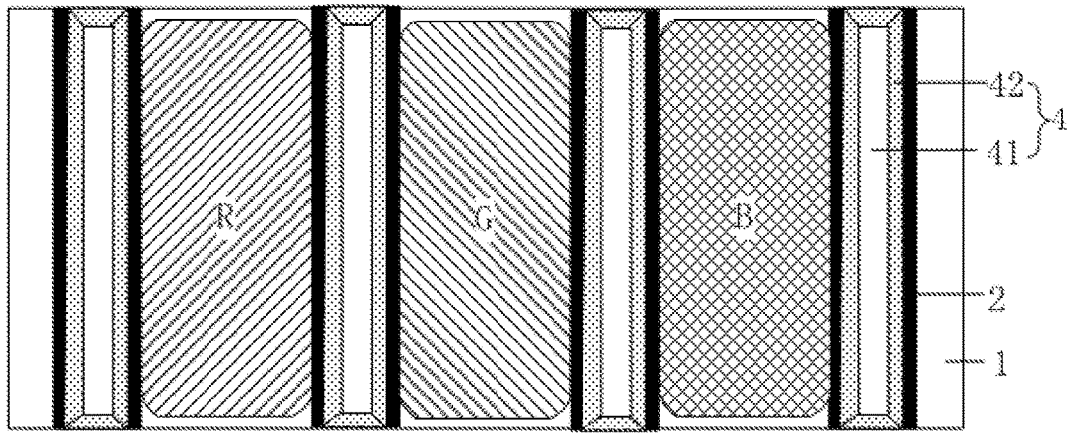

In the color filter substrate according to a third specific embodiment of the present invention, as shown in FIGS. 2a and 2b, the auxiliary functional layer 4 may comprise a light reflection layer 41 formed of metal material, and a light absorption layer 42 formed of opaque metal oxide material, which are disposed stackedly in sequence on the surface of each barrier pad 3. The light reflection layer 41 may cover over the surface of each barrier pad, as a result, the light reflection layer may come into a direct contact with a cathode of an organic light-emitting device on the array substrate, which improves electrical conductivity of the cathode and avoids drop off of the voltage because of reason including impedance of the cathode in a large size display, thereby avoiding the problem of uneven luminance between edges and the center of the display screen. The light absorption layer 42 may enwrap an outer side of each barrier pad, as a result, the light irradiated on the outer side of each barrier pad may be adsorbed, which achieves an effect of preventing the light from penetrating through the outer side of each barrier pad, and avoids a light mixing.

Each of the abovementioned three embodiments may prevent occurrence of the optical crosstalk among lights from adjacent sub-pixel units on the color filter substrate, thereby improving a display effect. The abovementioned three embodiments are only some examples for illustrate the present invention. In practical implementations, structure of the auxiliary functional layer is not limited to the abovementioned three. In practical implementations, which kind of these embodiments is used depends on actual requirements, and there is no limitation on this herein.

In one implementation, in the abovementioned color filter substrate according to embodiments of the present invention, material for each barrier pad may comprise transparent negative acryl resin material or polyimide resin material. Material for each barrier pad may be chosen in accordance with actual circumstance, and there is no limitation on this herein.

Figure 1B:
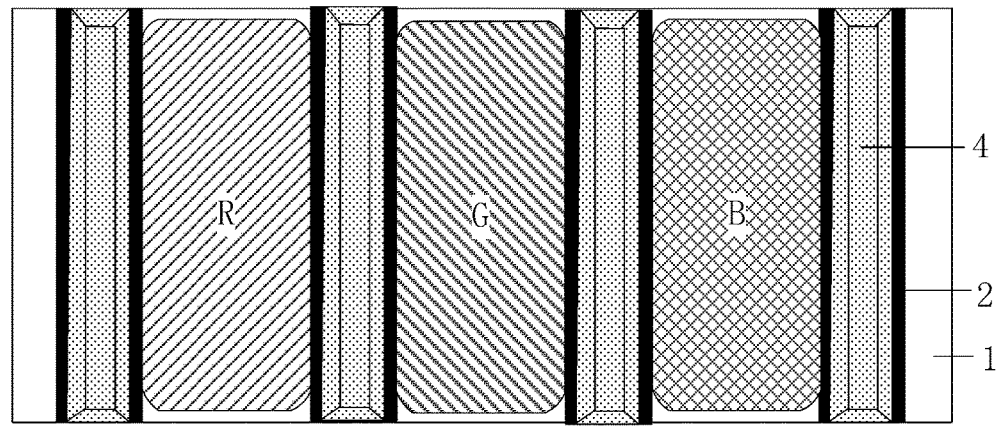

It should be noted that, various kinds of designs may be suitable for shape of the barrier pad. Preferably, referring to FIGS. 1a and 2a, shape of the barrier pad is in a trapezoidal structure. In order to avoid lateral leakage of the lights among adjacent sub-pixels on the color filter substrate, as shown in FIGS. 1b and 2b, a length of the barrier pad (along an up-down direction in Figures) may be greater than or equal to a length of the sub-pixel unit (along an up-down direction in Figures) on the color filter substrate, which may further prevent occurrence of the optical crosstalk among lights from adjacent sub-pixel units. Similarly, a maximum length of the barrier pad may be the same as the length of the black matrix. A width of the barrier pad (along a left-right direction in Figures) is less than or equal to the width of the black matrix, and it is not limited herein. As to a height of the barrier pad and the quantity, they may be decided in accordance with size of the display panel and pressure condition of the display panel suffered from external environment. In case that material for the barrier pad is negative acryl resin material, the height of the barrier pad may be ranged from 2 μm to 3 μm.

In one implementation, the color filter substrate according to embodiments of the present invention generally further comprises structures of other layers including, e.g., color filter layer, planarization layer, etc., and, these specific structures may be implemented in various ways. For example, the color filter layer may comprise filters with three different colors (R, G, B), or with four different colors (R, G, B, W). The specific structures are determined by the light emitting modes of the organic light-emitting display panel, and these specific structures are not limited herein.

Based on the same invention concept, there also provides a method for manufacturing the above color filter substrate, according to embodiments of the present invention. Principle of the method to solve the problem is similar to that of the above color filter substrate, so, for implementation of the method, implementation of the color filter substrate may be referred to, and the repetitious details need not be given herein.

Figure 3:
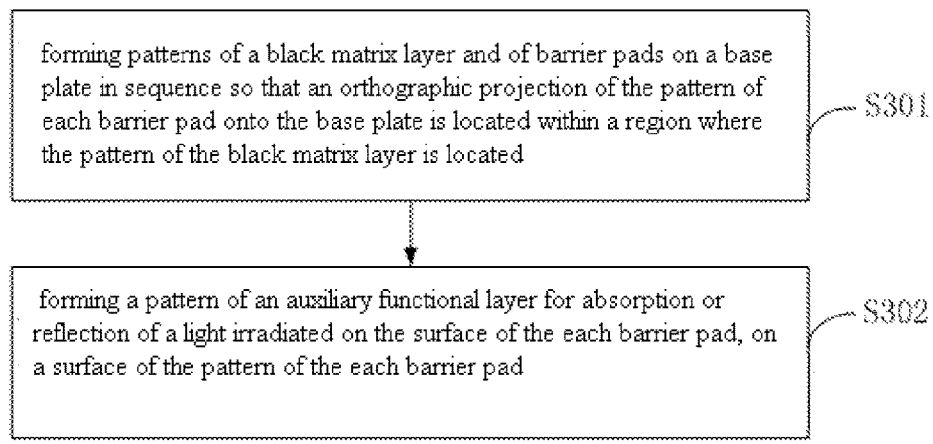
FIG. 3 is a flow diagram of a method for manufacturing a color filter substrate according to an embodiment of the present invention.

In one implementation, referring to FIG. 3, the method for manufacturing the above color filter substrate, according to embodiments of the present invention, comprises the following steps:

a step S301 of forming patterns of a black matrix layer and of barrier pads on a base plate in sequence so that an orthographic projection of the pattern of each barrier pad onto the base plate is located within a region where the pattern of the black matrix layer is located; and a step S302 of forming a pattern of an auxiliary functional layer for absorption or reflection of a light irradiated on the surface of each barrier pad, on a surface of the pattern of each barrier pad.

In the abovementioned color filter substrate according to an embodiment of the present invention, the orthographic projection of the pattern of each barrier pad onto the base plate is located within the region where the pattern of the black matrix layer is located, so an aperture ratio of the color filter substrate will not be taken up. Meanwhile, the surface of the pattern of each barrier pad is provided with the pattern of the auxiliary functional layer for absorption or reflection of a light irradiated on the surface of each barrier pad, so, occurrence of the optical crosstalk among lights from adjacent sub-pixel units of the color filter substrate is prevented and the light mixing is avoided, and light extraction efficiency and display contrast are further improved, thereby improving a display effect.

In the above method of manufacturing the color filter substrate according to a first specific embodiment of the present invention, the step S302 of forming the pattern of the auxiliary functional layer may be achieved in the following ways.

Firstly, to deposit a layer of opaque metal oxide material on the base plate formed with the pattern of each barrier pad.

Then, to form, by implementing a patterning process to the opaque metal oxide material, a pattern of a light adsorption layer that covers over the pattern of each barrier pad.

In the above method of manufacturing the color filter substrate according to a second specific embodiment of the present invention, the step S302 of forming the pattern of the auxiliary functional layer may be also achieved in the following ways.

Firstly, to deposit a layer of metal material on the base plate formed with the pattern of each barrier pad.

Then, to form, by implementing a patterning process to the metal material, a pattern of a light reflection layer that covers over the pattern of each barrier pad.

In the above method of manufacturing the color filter substrate according to a third specific embodiment of the present invention, after the pattern of the light reflection layer that covers over the pattern of each barrier pad is formed in the second specific embodiment, the method of manufacturing the color filter substrate may further comprises:

firstly, depositing a layer of opaque metal oxide material on the base plate formed with the pattern of the light reflection layer; and then, forming, by implementing a patterning process to the opaque metal oxide material, a pattern of a light absorption layer that enwraps an outer side of each barrier pad.

Referring to FIGS. 4a to 4d, an example of the method for manufacturing the above color filter substrate, according to embodiments of the present invention, will be described hereafter. The method comprises the following specific steps.

A first step is to form patterns of a black matrix layer, of a color filter layer and of a planarization layer on a base plate in sequence.

Figure 4A:
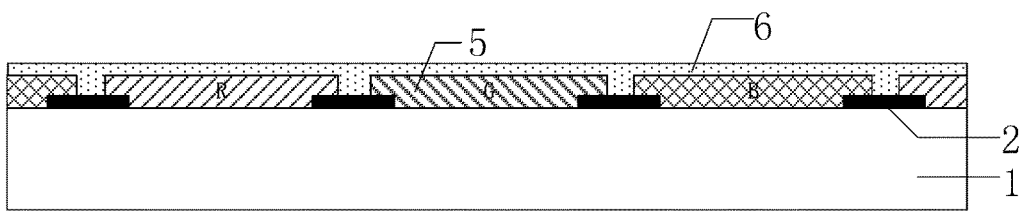
FIGS. 4a to 4d are schematic structural views of a color filter substrate after implementations of these steps of a method for manufacturing the color filter substrate according to an embodiment of the present invention, respectively.

In one implementation, as shown in FIG. 4a, a layer of high light-shielding performance material is deposited on the base plate 1, and the pattern of the black matrix layer 2 is formed by a patterning process. Specifically, material for the black matrix layer is resin material doped with light-shielding performance material. The black matrix layer 2 is provided to space the filters with different colors in the color filter layer from each other, which may reduce leakage of the lights among the pixel regions, prevent leakage of the back light, enhance the display contrast, avoid the light mixing and improve color purity. Then, patterns of a color filter layer 5 including filters with three colors R, G, B and of a planarization layer 6 are formed on the base plate formed with the black matrix layer 2.

A second step is to form patterns of barrier pads on the planarization layer, so that an orthographic projection of the pattern of each barrier pad onto the base plate is located within a region where the pattern of the black matrix layer is located.

Figure 4B:
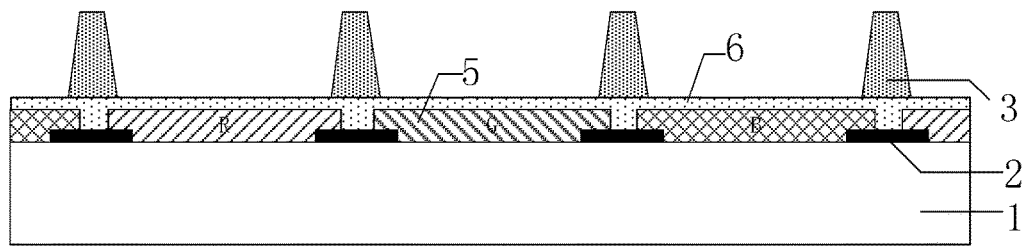

In one implementation, as shown in FIG. 4b, a layer of transparent negative acryl photoresist material is deposited on the planarization layer, and, the patterns of the barrier pads 3 are formed after implementing the processes of exposure, development, etc.

A third step is to form a pattern of a light reflection layer on a surface of the barrier pad.

Figure 4C:
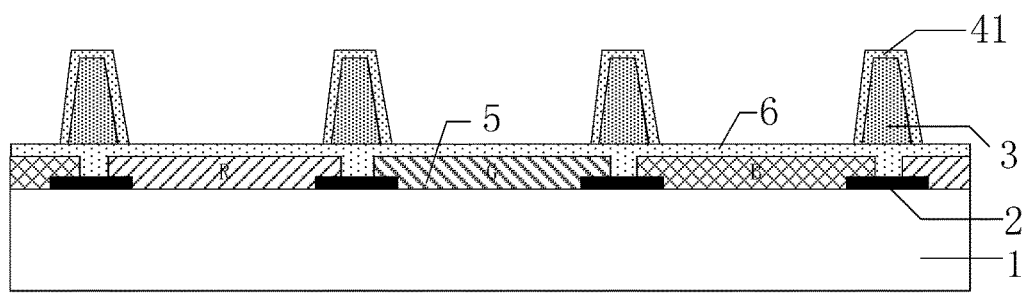

In one implementation, as shown in FIG. 4c, a layer of metal material is deposited on the base plate 1 formed with the barrier pads 3, and, the pattern of the light reflection 41 covering the pattern of the barrier pad 3 is formed after implementing exposure and development with positive photoresist and then forming a coating on a surface of the barrier pad 3 by means of a wet etching method.

A fourth step is to form a pattern of a light adsorption layer on the light reflection layer.

Figure 4D:
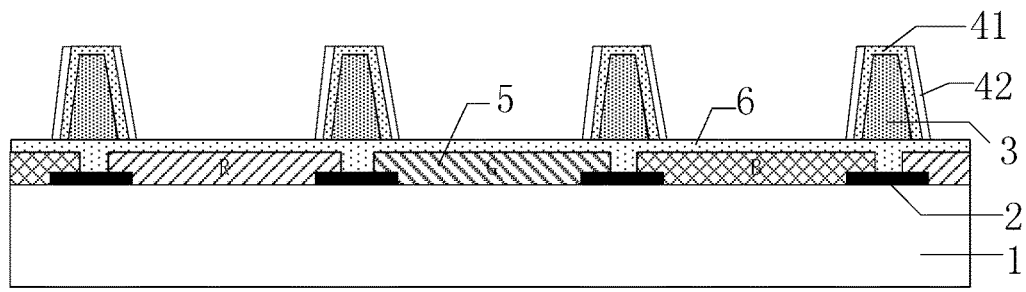

In one implementation, as shown in FIG. 4d, a layer of opaque metal oxide material is deposited on the base plate 1 formed with the pattern of the light reflection layer 41. The pattern of the light absorption layer 42 enwrapping an outer side of the barrier pad 3 is formed by etching off opaque metal oxide material located on upper surface of the barrier pad 3 and light transmission regions by means of partial etching or half-tone mask processes and the like.

Thus, the above color filter substrate according to embodiments of the present invention will be manufactured by the above first to fourth steps in this example.

Figure 5:
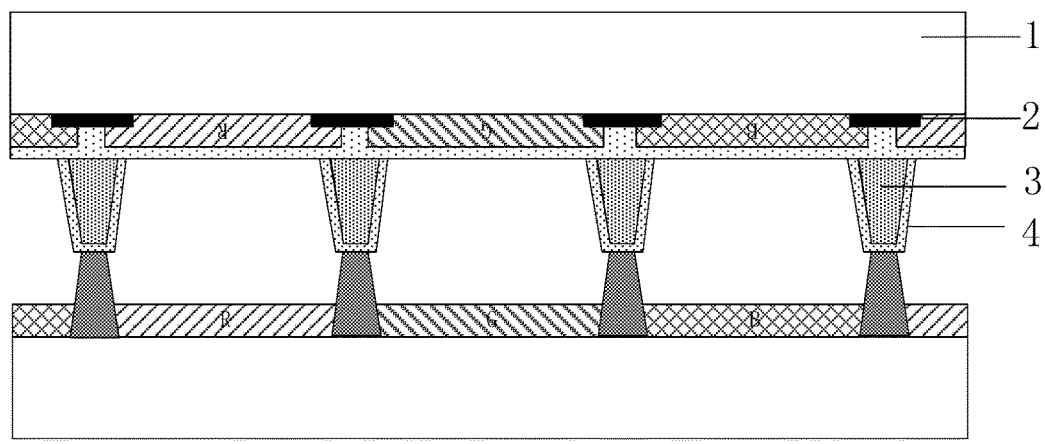
FIG. 5 is a schematic structural view of an organic light-emitting display panel according to an embodiment of the present invention.

Based on the same invention concept, according to embodiments of the present invention, there also provides an organic light-emitting display panel comprising the abovementioned color filter substrate according to embodiments of the present invention and an array substrate opposite to each other; wherein, the array substrate comprises a RGB light-emitting material layer or a white organic light-emitting diode. That is, as to the light-emitting manner, RGB light-emitting material or white organic light-emitting diode may be adopted in the organic light-emitting display panel according to embodiments of the present invention, and it is not limited herein. In one embodiment, referring to FIG. 5, in a case that RGB light-emitting materials are adopted in the organic light-emitting display panel, in the light-emitting manner, regions where the RGB light-emitting materials are located on the array substrate correspond, one-to-one, to regions where the RGB filters are located on the color filter substrate, namely, a layer of R light-emitting material corresponds to a R filter, a layer of G light-emitting material corresponds to a G filter, and, a layer of B light-emitting material corresponds to a B filter. In addition, the array substrate may further comprise a thin-film transistor, preferably, having a drain that is connected to an anode layer of the organic light-emitting device through a contact via hole running through the planarization layer thereabove, here, the organic light-emitting device is driven to emit light by the thin-film transistor.

Based on the same invention concept, according to embodiments of the present invention, there also provides a display apparatus comprising the abovementioned organic light-emitting display panel according to embodiments of the present invention. The display apparatus may be any products or components having a displaying function, such as, mobile phone, tablet PC, TV, display, notebook PC, digit photo frame, navigating instrument, etc. Those skilled in the art should understand that other necessary components will be included in the display apparatus, and the repetitious details need not be given herein, and it should not be constructed to limit the present invention. For implementation of the display apparatus, abovementioned implementations of the color filter substrate and of the organic light-emitting display panel may be referred to, and the repetitious details need not be given herein.

Concerning the above, with the color filter substrate and the method for manufacturing the same, an OLED display panel and a display apparatus, abovementioned according to embodiments of the present invention, in the abovementioned color filter substrate, the orthographic projection of the pattern of each barrier pad onto the base plate 1 is located within the region where the pattern of the black matrix layer is located, so an aperture ratio of the color filter substrate will not be taken up. Meanwhile, the surface of the pattern of each barrier pad is provided with the auxiliary functional layer for absorption or reflection of a light irradiated on the surface of each barrier pad, so, occurrence of the optical crosstalk among lights from adjacent sub-pixel units of the color filter substrate is prevented and the light mixing is avoided, and light extraction efficiency and display contrast are further improved, thereby improving a display effect.

Obviously, various changes and modifications may be made, by those skilled in the art, therein without departing from the spirit and scope of the present invention. Accordingly, the present invention intends to contain these changes and modifications if these changes and modifications of the present invention fall within the scope of the present invention defined in the appended claims and their equivalents.

What is claimed is:

1. A color filter substrate, comprising: a base plate, and a black matrix layer and a barrier pad layer stacked in sequence on the base plate, the barrier pad layer comprising a plurality of barrier pads disposed on the same layer to form supports; wherein an orthographic projection of a pattern of each barrier pad onto the base plate is located within a region where a pattern of the black matrix layer is located; and an upper surface and side surfaces of each barrier pad are provided with an auxiliary functional layer for absorption or reflection of a light irradiated on the upper surface and the side surfaces of each barrier pad.

2. The color filter substrate of claim 1, wherein, the auxiliary functional layer comprises a light absorption layer formed of opaque metal oxide material and covering over each barrier pad.

3. The color filter substrate of claim 1, wherein, the auxiliary functional layer comprises a light reflection layer formed of metal material and covering over each barrier pad.

4. The color filter substrate of claim 1, wherein, the auxiliary functional layer comprises: a light reflection layer formed of metal material and covering over each barrier pad, and a light absorption layer formed of opaque metal oxide material and enwrapping an outer side of each barrier pad, which are stacked in sequence on the upper surface and the side surfaces of each barrier pad.

5. The color filter substrate of claim 1, wherein, material for each barrier pad comprises transparent negative acryl resin material or polyimide resin material.

6. An organic light-emitting display panel comprising a color filter substrate of claim 1 and an array substrate opposite to each other; wherein, the array substrate comprises a RGB light-emitting material layer or a white organic light-emitting diode.

7. A display apparatus comprising an organic light-emitting display panel of claim 6.

8. A method for manufacturing a color filter substrate, the method comprising steps of:

forming patterns of a black matrix layer and of barrier pads that form supports on a base plate in sequence so that an orthographic projection of the pattern of each barrier pad onto the base plate is located within a region where the pattern of the black matrix layer is located; and forming a pattern of an auxiliary functional layer for absorption or reflection of a light irradiated on an upper surface and side surfaces of each barrier pad, on the upper surface and the side surface of the pattern of each barrier pad.

9. The method of claim 8, wherein, the step of forming the pattern of the auxiliary functional layer further comprises sub-steps of:

depositing a layer of opaque metal oxide material on the base plate formed with the pattern of each barrier pad; and forming, by implementing a patterning process to the opaque metal oxide material, a pattern of a light adsorption layer that covers over the pattern of each barrier pad.

10. The method of claim 8, wherein, the step of forming the pattern of the auxiliary functional layer further comprises sub-steps of:

depositing a layer of metal material on the base plate formed with the pattern of each barrier pad; and forming, by implementing a patterning process to the metal material, a pattern of a light reflection layer that covers over the pattern of each barrier pad.

11. The method of claim 10, after the sub-step of forming the pattern of the light reflection layer, further comprising steps of:

depositing a layer of opaque metal oxide material on the base plate formed with the pattern of the light reflection layer; and forming, by implementing a patterning process to the opaque metal oxide material, a pattern of a light absorption layer that enwraps an outer side of the barrier pad.

* * * * *